US012610581B2

(12) United States Patent
Su et al.

(10) Patent No.: US 12,610,581 B2
(45) Date of Patent: Apr. 21, 2026

(54) AMORPHOUS SILICON THIN-FILM TRANSISTOR, METHOD FOR PREPARING SAME, AND DISPLAY PANEL

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Haidong Su, Beijing (CN); Feng Li, Beijing (CN); Yezhou Fang, Beijing (CN); Lei Yao, Beijing (CN); Lei Yan, Beijing (CN); Chenglong Wang, Beijing (CN); Kai Li, Beijing (CN); Xiaogang Zhu, Beijing (CN); Hua Yang, Beijing (CN); Lin Hou, Beijing (CN); Yun Gao, Beijing (CN)

(73) Assignees: ORDOS YUANSHEND OPTOELECTRONICS CO., LTD, Ordos (CN); BOE TECHNOLOGY GROUP CO., LTD., Beijing (CN)

( * ) Notice: Subject to any disclaimer, the term of this patent is extended or adjusted under 35 U.S.C. 154(b) by 727 days.

(21) Appl. No.: 17/907,790

(22) PCT Filed: Sep. 29, 2021

(86) PCT No.: PCT/CN2021/121965
§ 371 (c)(1),
(2) Date: Aug. 29, 2022

(87) PCT Pub. No.: WO2023/050238
PCT Pub. Date: Apr. 6, 2023

(65) Prior Publication Data
US 2024/0222511 A1     Jul. 4, 2024

(51) Int. Cl.
*H01L 29/786* (2006.01)
*H10D 30/01* (2025.01)
(Continued)

(52) U.S. Cl.
CPC ..... *H10D 30/6715* (2025.01); *H10D 30/0316* (2025.01); *H10D 30/0321* (2025.01);
(Continued)

(58) Field of Classification Search
CPC ........... H10D 30/6715; H10D 30/0316; H10D 30/0321; H10D 30/6732; H10D 30/6746;
(Continued)

(56) References Cited

U.S. PATENT DOCUMENTS

2002/0117671 A1   8/2002   Tateishi
2003/0124781 A1   7/2003   Lee
(Continued)

FOREIGN PATENT DOCUMENTS

CN     102646715 A     8/2012
CN     102881571 A     1/2013
(Continued)

*Primary Examiner* — Mohammed R Alam
(74) *Attorney, Agent, or Firm* — Lippes Mathias LLP

(57) ABSTRACT

Provided is an amorphous silicon thin-film transistor including an amorphous silicon semiconductor layer, a source electrode, and a drain electrode that are successively disposed on a base substrate. Ions doped by an ion implantation process are present in a region, proximal to the source electrode and the drain electrode, of the amorphous silicon semiconductor layer. A concentration of the ions in a surface region, proximal to the source electrode and the drain electrode, of the amorphous silicon semiconductor layer is greater than or equal to $5*10^{20}$ atoms/cc.

12 Claims, 5 Drawing Sheets

(51) Int. Cl.

| | | |
|---|---|---|
| *H10D 30/67* | (2025.01) | |
| *H01L 21/265* | (2006.01) | |
| *H01L 21/306* | (2006.01) | |
| *H10D 86/40* | (2025.01) | |
| *H10D 86/60* | (2025.01) | |

(52) U.S. Cl.
CPC ..... *H10D 30/6732* (2025.01); *H10D 30/6746* (2025.01); *H01L 21/26513* (2013.01); *H01L 21/30604* (2013.01); *H10D 86/425* (2025.01); *H10D 86/60* (2025.01)

(58) Field of Classification Search
CPC .. H10D 86/425; H10D 86/60; H10D 30/0314; H10D 30/67; H01L 21/26513; H01L 21/30604; H01L 21/32134
See application file for complete search history.

(56) References Cited

U.S. PATENT DOCUMENTS

| | | | | |
|---|---|---|---|---|
| 2014/0094002 | A1 | 4/2014 | Ma | |
| 2017/0125606 | A1* | 5/2017 | Nunan | .............. H10D 30/0316 |

| | | | | |
|---|---|---|---|---|
| 2017/0162706 | A1 | 6/2017 | Lu | |
| 2017/0162707 | A1 | 6/2017 | Lv et al. | |
| 2019/0221672 | A1 | 7/2019 | Xiao | |
| 2021/0343878 | A1* | 11/2021 | Ohta | ................... H01L 21/0262 |

FOREIGN PATENT DOCUMENTS

| | | | |
|---|---|---|---|
| CN | 104576399 | A | 4/2015 |
| CN | 105161503 | A | 12/2015 |
| CN | 105870203 | A | 8/2016 |
| CN | 208767303 | U | 4/2019 |
| CN | 110504164 | A | 11/2019 |
| CN | 113658869 | A | 11/2021 |
| JP | 2018170335 | A | 11/2018 |
| KR | 19990081221 | A | 11/1999 |
| KR | 20000072230 | A | 12/2000 |
| KR | 20020056410 | A | 7/2002 |
| KR | 20030020170 | A | 3/2003 |

* cited by examiner

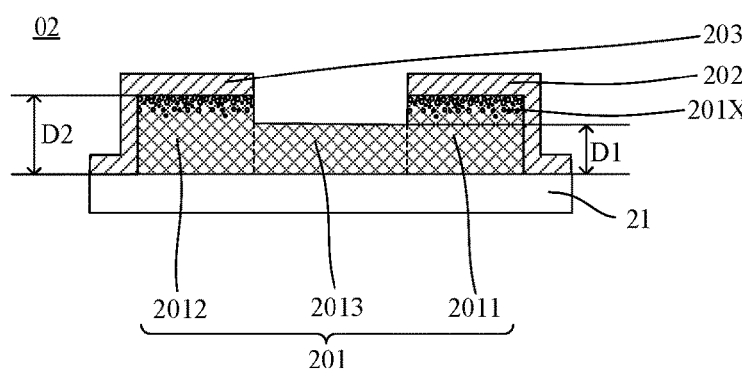

FIG. 4

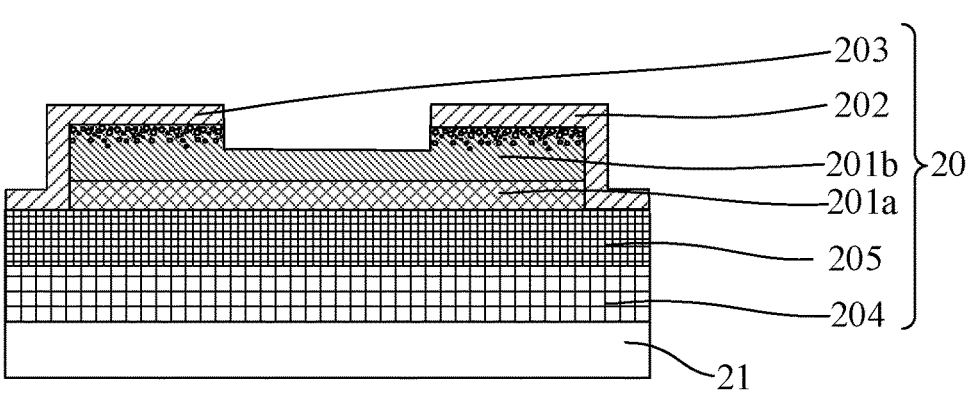

FIG. 5

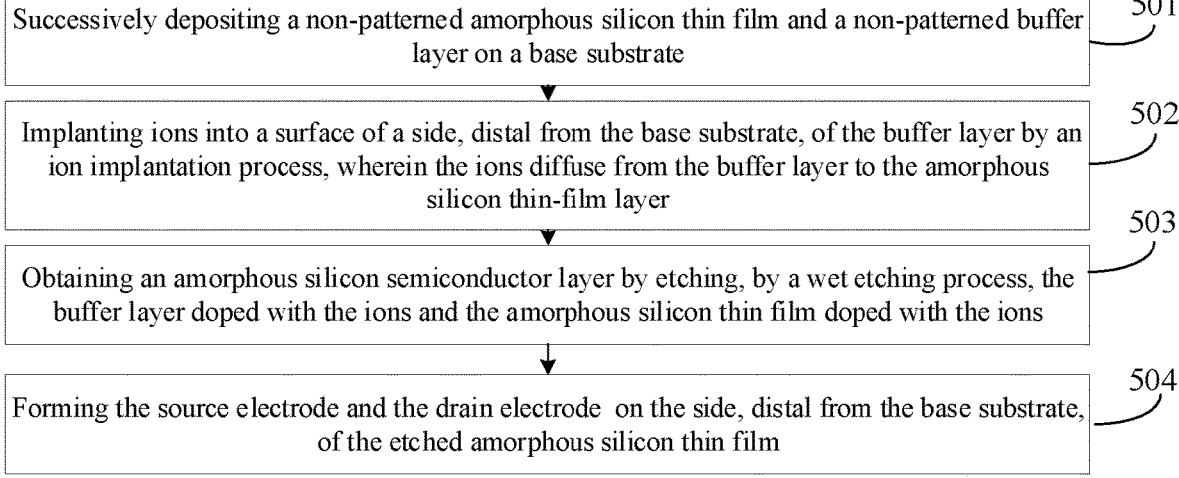

| | |
|---|---|
| Successively depositing a non-patterned amorphous silicon thin film and a non-patterned buffer layer on a base substrate | 501 |
| Implanting ions into a surface of a side, distal from the base substrate, of the buffer layer by an ion implantation process, wherein the ions diffuse from the buffer layer to the amorphous silicon thin-film layer | 502 |
| Obtaining an amorphous silicon semiconductor layer by etching, by a wet etching process, the buffer layer doped with the ions and the amorphous silicon thin film doped with the ions | 503 |
| Forming the source electrode and the drain electrode on the side, distal from the base substrate, of the etched amorphous silicon thin film | 504 |

FIG. 6 depth (Å)

depth (Å)

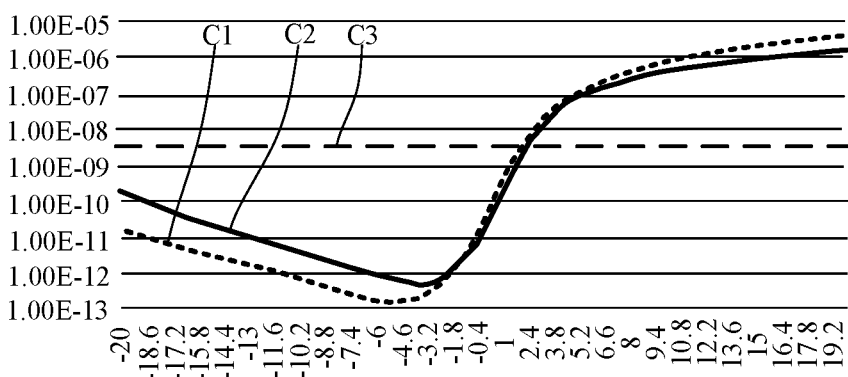

FIG.10

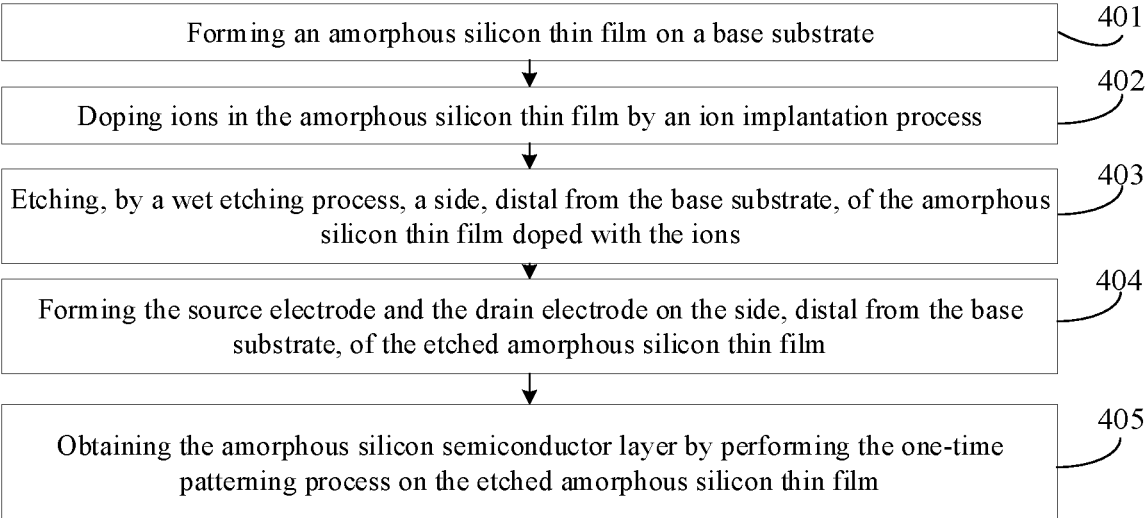

| | |
|---|---|
| Forming an amorphous silicon thin film on a base substrate | 401 |
| Doping ions in the amorphous silicon thin film by an ion implantation process | 402 |
| Etching, by a wet etching process, a side, distal from the base substrate, of the amorphous silicon thin film doped with the ions | 403 |
| Forming the source electrode and the drain electrode on the side, distal from the base substrate, of the etched amorphous silicon thin film | 404 |
| Obtaining the amorphous silicon semiconductor layer by performing the one-time patterning process on the etched amorphous silicon thin film | 405 |

FIG.11

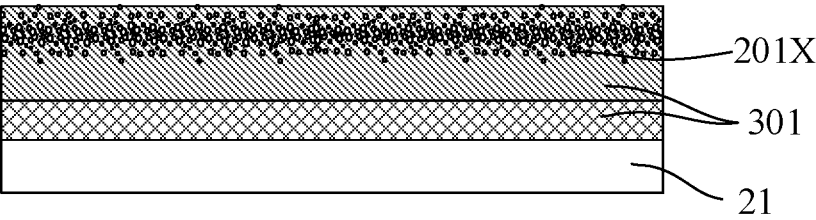

AMORPHOUS SILICON THIN-FILM TRANSISTOR, METHOD FOR PREPARING SAME, AND DISPLAY PANEL

CROSS-REFERENCE TO RELATED APPLICATION

This application is a 371 of PCT application No. PCT/CN2021/121965, filed on Sep. 29, 2021, the content of which is herein incorporated by reference in its entirety.

TECHNICAL FIELD

The present disclosure relates to the field of display technologies, and in particular, relates to an amorphous silicon thin-film transistor, a method for preparing the same, and a display panel.

BACKGROUND

A thin-film transistor (TFT) plays an important role in a display panel as a switch device.

SUMMARY

Embodiments of the present disclosure provide an amorphous silicon thin-film transistor, a method for preparing the same, and a display panel.

In one aspect of the embodiments of the present disclosure, an amorphous silicon thin-film transistor is provided. The amorphous silicon thin-film transistor includes:

an amorphous silicon semiconductor layer, a source electrode, and a drain electrode that are successively disposed on a base substrate;

wherein ions doped by an ion implantation process are present in a region, proximal to the source electrode and the drain electrode, of the amorphous silicon semiconductor layer, a concentration of the ions in a surface region, proximal to the source electrode and the drain electrode, of the amorphous silicon semiconductor layer being greater than or equal to $5*10^{\wedge}20$ atoms/cc.

Optionally, the ions doped by the ion implantation process are present at a depth of the surface region, proximal to the source electrode and the drain electrode, of the amorphous silicon semiconductor layer, and the concentration of the ions decreases along a direction away from the surface region.

Optionally, the ions doped by the ion implantation process are present at the depth of the surface region, proximal to the source electrode and the drain electrode, of the amorphous silicon semiconductor layer, and the concentration of the ions increases first and then decreases along a direction away from the surface region;

wherein a thickness of a region where the concentration of the ions increases is less than a thickness of a region where the concentration of the ions decreases.

Optionally, at a first depth of the surface region, proximal to the source electrode and the drain electrode, of the amorphous silicon semiconductor layer, the concentration of the ions is greater than or equal to $3*10^{\wedge}20$ atoms/cc;

wherein the first depth is from 0 to 50 Å excluding 0.

Optionally, at a second depth of the surface region, proximal to the source electrode and the drain electrode, of the amorphous silicon semiconductor layer, the concentration of the ions is greater than or equal to $5*10^{\wedge}20$ atoms/cc;

wherein the second depth is from 0 to 20 Å excluding 0;

at a third depth of the surface region, proximal to the source electrode and the drain electrode, of the amorphous silicon semiconductor layer, the concentration of the ions is greater than or equal to $5*10^{\wedge}20$ atoms/cc;

wherein the third depth is from 600 to 1300 Å;

at a fourth depth of the surface region, proximal to the source electrode and the drain electrode, of the amorphous silicon semiconductor layer, the concentration of the ions is greater than or equal to $3*10^{\wedge}19$ atoms/cc; and wherein the fourth depth is greater than or equal to 1300 Å.

Optionally, the amorphous silicon semiconductor layer includes a source electrode contact region, a drain electrode contact region, and a channel region disposed between the source electrode contact region and the drain electrode contact region;

wherein the ions are disposed in the source electrode contact region and the drain electrode contact region.

Optionally, a concentration of ions doped in a region, proximal to the base substrate, of the source electrode contact region and the drain electrode contact region is less than or equal to $3*10^{\wedge}19$ atoms/cc.

Optionally, a concentration of ions doped in the channel region is less than or equal to $3*10^{\wedge}19$ atoms/cc; and a thickness of the channel region and a thickness of the region, proximal to the base substrate, of the source electrode contact region and the drain electrode contact region are from 500 to 1000 Å.

Optionally, the ions include phosphorus ions $P^{+}$.

Optionally, the amorphous silicon semiconductor layer includes a first amorphous silicon semiconductor layer and a second amorphous silicon semiconductor layer that are stacked along a direction away from the base substrate;

wherein a thickness of the first amorphous silicon semiconductor layer is less than a thickness of the second amorphous silicon semiconductor layer, and a density of the first amorphous silicon semiconductor layer is greater than a density of the second amorphous silicon semiconductor layer.

Optionally, a ratio of the thickness of the first amorphous silicon semiconductor layer to the thickness of the second amorphous silicon semiconductor layer ranges from 0.1 to 0.5.

Optionally, the amorphous silicon semiconductor layer is obtained by successively preforming the ion implantation process, a wet etching process, and a one-time patterning process on an amorphous silicon thin film.

In another aspect of the embodiments of the present disclosure, a method for preparing an amorphous silicon thin-film transistor is provided. The method includes:

successively forming an amorphous silicon semiconductor layer, a source electrode, and a drain electrode on a base substrate;

forming the amorphous silicon semiconductor prior to forming the source electrode and the drain electrode, including:

successively depositing a non-patterned amorphous silicon thin film and a non-patterned buffer layer on the base substrate, wherein the buffer layer is made of silicon oxide, silicon nitride, or silicon nitrogen oxide;

implanting ions into a surface of a side, distal from the base substrate, of the buffer layer by an ion implantation process, wherein the ions diffuse from the buffer layer to an amorphous silicon thin-film layer; and obtaining the amorphous silicon semiconductor layer by etching, by the wet etching process, the buffer layer doped with the ions and the amorphous silicon thin film doped with the ions, wherein a concentration of ions in a surface region, proximal to the source electrode and the drain electrode, of the amorphous silicon semiconductor layer is greater than or equal to $5*10^20$ atoms/cc.

Optionally, obtaining the amorphous silicon semiconductor layer by etching, by the wet etching process, the buffer layer doped with the ions and the amorphous silicon thin film doped with the ions includes:

completely etching, by the wet etching process, a part of the buffer layer and a part of the amorphous silicon thin film disposed outside an active layer region;

completely etching a part, disposed in the active layer region, of the buffer layer by the wet etching process, and reserving the amorphous silicon thin film which is implanted with the ions; and etching a channel region, in the reserved amorphous silicon thin film, disposed between a source electrode contact region and a drain electrode contact region, and reserving a part, where a concentration of the ions is less than or equal to $3*10^19$ atoms/cc, of the channel region.

Optionally, a thickness of the buffer layer is less than a thickness of the amorphous silicon thin film.

Optionally, the thickness of the buffer layer is from 200 to 300 Å;

the thickness of the amorphous silicon thin film is from 1400 to 2000 Å; and an etching thickness of the wet etching process is from 20 to 30 Å.

Optionally, an etching solution configured in the wet etching process is an acid etching solution.

Optionally, an etching thickness of the channel region, in the reserved amorphous silicon thin film, disposed between a source electrode contact region and a drain electrode contact region is greater than or equal to 500 Å.

Optionally, an atmosphere configured in the ion implantation process includes phosphine, an ion dose is greater than or equal to $e^{15}$ ions per square centimeter, and an acceleration voltage is greater than or equal to 20 kilovolts and less than or equal to 30 kilovolts.

Optionally, forming the amorphous silicon thin film on the base substrate, including:

depositing a first amorphous silicon thin film on the base substrate in a first film layer deposition rate; and depositing a second amorphous silicon thin film on a side, distal from the base substrate, of the fist amorphous silicon thin film in a second film layer deposition rate; wherein the first film layer deposition rate is from 4 to 8 Å/second; and the second film layer deposition rate is from 30 to 50 Å/second.

In still another aspect of embodiments of the present disclosure, a display panel is provided. The display panel includes: a base substrate, and a plurality of amorphous silicon thin-film transistors disposed on the base substrate defined as above; wherein the base substrate is provided with the amorphous silicon thin-film transistors and low temperature poly-silicon thin-film transistors synchronously.

BRIEF DESCRIPTION OF THE DRAWINGS

The drawings herein are incorporated in and constitute a part of this specification of the present disclosure, showing embodiments consistent with the present disclosure, and explaining the principles of the present disclosure together with the description.

FIG. 4 is another schematic structural diagram of a display panel where an amorphous silicon thin-film transistor is configured according to an embodiment of the present disclosure;

FIG. 5 is still another schematic structural diagram of a display panel where an amorphous silicon thin-film transistor is configured according to an embodiment of the present disclosure;

FIG. 6 is a flowchart of a method for preparing an amorphous silicon thin-film transistor according to an embodiment of the present disclosure;

FIG. 10 is a comparison diagram of switching characteristics between an amorphous silicon thin-film transistor prepared according to an embodiment of the present disclosure and an amorphous silicon thin-film transistor prepared according to the related art;

FIG. 11 is a flowchart of another method for preparing an amorphous silicon thin-film transistor according to an embodiment of the present disclosure;

FIG. 12 is a schematic structural diagram of another base substrate according to an embodiment of the present disclosure.

DETAILED DESCRIPTION

The present disclosure is described in further detail with reference to the enclosed drawings, to clearly present the objects, technical solutions, and advantages of the present disclosure.

In the related art, the thin-film transistor generally includes a gate electrode, a gate insulation film, an active layer, and a source-drain electrode layer that are successively stacked along a direction away from a base substrate. The source-drain electrode layer includes a source electrode and a drain electrode. The active layer may be made of amorphous silicon (a-Si).

However, ohmic contact performance between the active layer and the source-drain electrode layer in the related art is poor.

Figure 1:
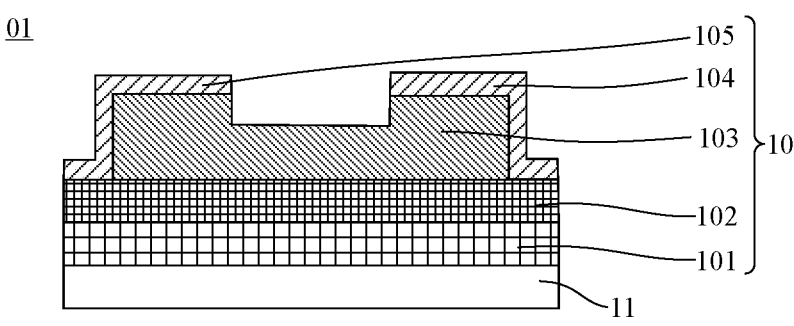
FIG. 1 is a schematic structural diagram of a display panel where an amorphous silicon thin-film transistor is configured.

FIG. 1 is a schematic structural diagram of a display panel where an amorphous silicon thin-film transistor is configured. As illustrated in FIG. 1, the amorphous silicon thin-film transistor 10 in the display panel 01 may include: a gate electrode 101, a gate insulator (GI) layer 102, an amorphous silicon semiconductor layer 103, a source electrode 104, and a drain electrode 105 that are successively disposed on a base substrate 11. Ions are doped in the amorphous silicon semiconductor layer 103. The N-type doped amorphous silicon semiconductor layer 103 may be formed generally by uniformly doping phosphine ($PH_3$) gas during a chemical vapor deposition (CVD) of amorphous silicon semiconductor material. By doping the ions in the amorphous silicon semiconductor layer 103, the amorphous silicon semiconductor layer 103 is in great ohmic contact with the source electrode 104 and the drain electrode 105. In this way, the amorphous silicon thin-film transistor has a great on-state current and a small off-state current. That is, a switching characteristic of the amorphous silicon thin-film transistor is great.

In a production line of low temperature poly-silicon (LTPS) thin-film transistors, ions are generally doped into semiconductors by an ion implantation process. By the ion implantation process, ion beams accelerated to a high energy are implanted into a surface layer of semiconductors to change physical and chemical properties of the surface layer. For example, boron, phosphorus, or arsenic is implanted into silicon to change the conductivity of the silicon surface. A depth and a concentration of ion implantation may be precisely controlled by the ion implantation process. Based on this, production-line equipment of the low temperature poly-silicon thin-film transistor may be employed to develop a new preparation process of the amorphous silicon thin-film transistor and produce amorphous silicon thin-film transistors doped by the ion implantation process, which is conducive to product diversification of the production line and process integration.

Figure 2:
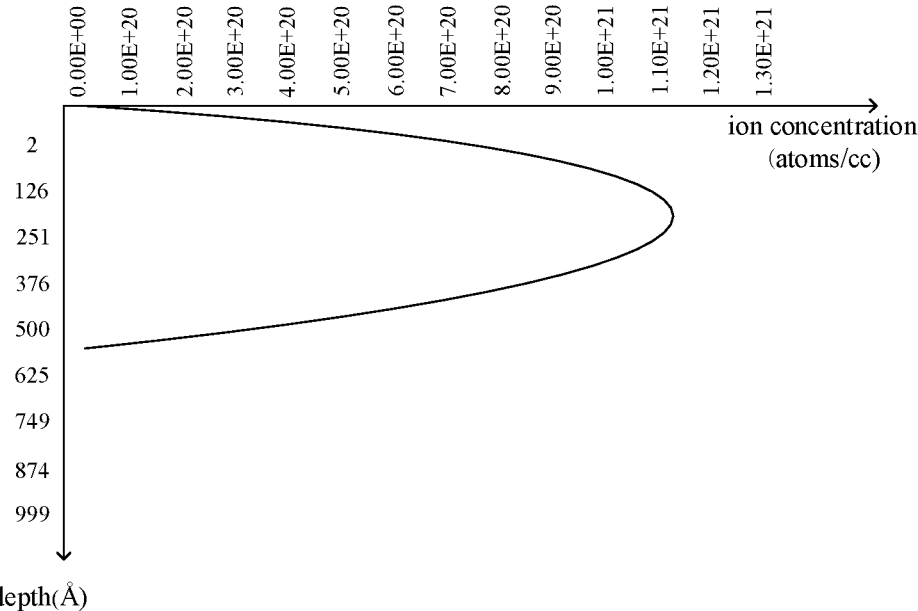
FIG. 2 is a schematic diagram of a concentration distribution, along with implantation depth, of ions doped in an amorphous silicon semiconductor layer.

In general, deposition equipment of the production line of the low temperature poly-silicon thin-film transistors is not provided with a doping gas pipeline. FIG. 2 is a schematic diagram of a concentration distribution, along with implantation depth, of ions doped in an amorphous silicon semiconductor layer. The abscissa represents a concentration of the ions doped in the amorphous silicon semiconductor layer, and the unit of the concentration is atoms/cc. The ordinate represents a depth of the amorphous silicon semiconductor layer, and the unit of the depth is A. The concentration of the ions doped in the amorphous silicon semiconductor layer may be detected by a detection device. The detection device may be a transmission electron microscope, a secondary ion mass spectroscopy (SIMS), or the like.

As illustrated in FIG. 2, the doped ions are implanted into the amorphous silicon semiconductor layer by the ion implantation process, and distribution of the doped ions in a thickness direction of the amorphous silicon semiconductor layer is approximately normal distribution. As a result, a concentration of doped ions in a surface layer of a side, proximal to the source electrode and the drain electrode, of the amorphous silicon semiconductor layer is low, and ohmic contact performance between the amorphous silicon semiconductor layer and a source-drain electrode layer is poor, such that the switching characteristic of a thin-film transistor is poor. Exemplarily, an on-to-off current ratio of the amorphous silicon thin-film transistor prepared by the ion implantation process is small (e.g., the on-to-off current ratio is less than 10^5). In this way, preparation processes of the low temperature poly-silicon thin-film transistor and the amorphous silicon thin-film transistor may not be integrated into one production line.

Part and all of the above technical problems may be solved by the following limited embodiments of the present disclosure.

An amorphous silicon thin-film transistor according to the embodiments of the present disclosure may be configured in a display region of the display panel.

The amorphous silicon thin-film transistor according to the embodiments of the present disclosure may be applicable to a small-sized mobile device (Mobile), a notebook (NB), an iPad, a small and medium-sized monitor (MNT), a medium and large-sized television (TV), a medium and large-sized monitor (MNT), and the like.

The amorphous silicon thin-film transistor according to the embodiments of the present disclosure may be applicable to the field of display or the field of chip. The flied of display may be a liquid crystal display (LCD) display panel, an organic light-emitting diode (OLED) display panel, a quantum dot light-emitting diode (QLED) display panel, a micro light-emitting diode (Micro LED) display panel, sensing, and other technical fields. The amorphous silicon thin-film transistor according to the embodiments of the present disclosure may be configured as a switch thin-film transistor in pixels.

Figure 3:
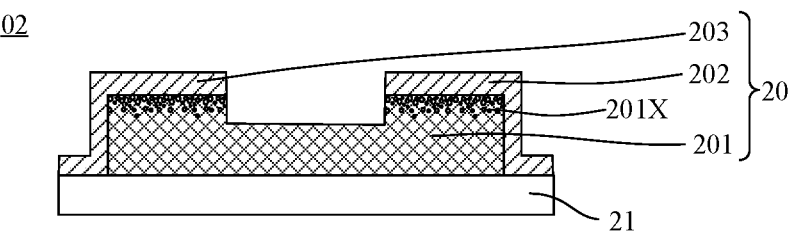
FIG. 3 is a schematic structural diagram of a display panel where an amorphous silicon thin-film transistor is configured according to an embodiment of the present disclosure.

FIG. 3 is a schematic structural diagram of a display panel where an amorphous silicon thin-film transistor is configured according to an embodiment of the present disclosure. Referring to FIG. 3, the amorphous silicon thin-film transistor 20 of the display panel 02 may include: an amorphous silicon semiconductor layer 201, a source electrode 202, and a drain electrode 203 that are successively disposed on a base substrate 21.

Referring to FIG. 3, the source electrode 202 and the drain electrode 203 are disposed on the same layer, and may be prepared by the same patterning process. The source electrode 202 and the drain electrode 203 are both electrically connected to the amorphous silicon semiconductor layer 201.

Ions 201X doped by an ion implantation process are present in a region, proximal to the source electrode 202 and the drain electrode 203, of the amorphous silicon semiconductor layer 201, and a concentration of the ions in a surface region, proximal to the source electrode 202 and the drain electrode 203, of the amorphous silicon semiconductor layer 201 is greater than or equal to 5*10^20 atoms/cc.

Because a concentration of ions 201X doped in unit volume of the surface region of the amorphous silicon semiconductor layer 201 is high (that is, the number of ions in unit volume is high), the amorphous silicon semiconductor layer 201 is in great ohmic contact with the source electrode 202 and the drain electrode 201. In this way, the amorphous silicon thin-film transistor 20 is provided with a great on-state current.

In summary, the embodiments of the present disclosure provide an amorphous silicon thin-film transistor. The ions doped by the ion implantation process are present in the region, proximal to the source electrode and the drain electrode, of the amorphous silicon semiconductor layer, and the concentration of the ions in the surface region, proximal to the source electrode and the drain electrode, of the amorphous silicon semiconductor is greater than or equal to 5*10^20 atoms/cc. In this way, the amorphous silicon semiconductor layer is in great ohmic contact with the source electrode and the drain electrode, and thus the on-state current of the amorphous silicon thin-film transistor is enhanced.

Optionally, as illustrated in FIG. 3, the ions 201X doped by the ion implantation process are present at a depth of the surface region, proximal to the source electrode 202 and the drain electrode 203, of the amorphous silicon semiconductor layer 201, and the concentration of the ions 201X decreases along a direction away from the surface region. In the embodiments of the present disclosure, in a region, distal from the source electrode 202 and the drain electrode 203, of the amorphous silicon semiconductor layer 201, the number of ions doped in unit volume of the amorphous silicon semiconductor layer 201 is small or even zero. In this way, a leakage current in the region, distal from the source electrode 202 and the drain electrode 203, of the amorphous silicon semiconductor 201 is small, and an off-state current of the amorphous silicon thin-film transistor 20 is reduced. Therefore, the amorphous silicon thin-film transistor according to the embodiments of the present disclosure has a high on-to-off current ratio, and the switching characteristic of the amorphous silicon thin-film transistor is great.

In some embodiments, the ions 201X doped by the ion implantation process are present at the depth of the surface region, proximal to the source electrode 202 and the drain electrode 203, of the amorphous silicon semiconductor layer 201, and the concentration of the ions 201X may increase and then decrease along the direction away from the surface region. A thickness of a region where the concentration of the ions 201X increases is less than a thickness of a region where the concentration of the ions 201X decreases. In this way, in the region, distal from the source electrode 202 and the drain electrode 203, of the amorphous silicon semiconductor layer 201, the number of ions 201X doped in unit volume of the amorphous silicon semiconductor layer 201 is small or even zero. Therefore, the leakage current in the region, distal from the source electrode 202 and the drain electrode 203, of the amorphous silicon semiconductor 201 is small, and the off-state current of the amorphous silicon thin-film transistor 20 is reduced. The amorphous silicon thin-film transistor according to the embodiments of the present disclosure has a high on-to-off current ratio, and the switching characteristic of the amorphous silicon thin-film transistor is great.

Optionally, at a first depth of the surface region, proximal to the source electrode 202 and the drain electrode 203, of the amorphous silicon semiconductor layer 201, the concentration of the ions 201X is greater than or equal to $3*10^{\wedge}20$ atoms/cc. The first depth is from 0 to 50 Å excluding 0. In this way, the amorphous silicon semiconductor layer is in great ohmic contact with the source electrode and the drain electrode, and thus the on-state current of the amorphous silicon thin-film transistor is enhanced.

Optionally, at a second depth of the surface region, proximal to the source electrode 202 and the drain electrode 203, of the amorphous silicon semiconductor layer 201 according to the embodiments of the present disclosure, the concentration of the ions 201X is greater than or equal to $5*10^{\wedge}20$ atoms/cc. The second depth is from 0 to 20 Å excluding 0.

Optionally, at a third depth of the surface region, proximal to the source electrode 202 and the drain electrode 203, of the amorphous silicon semiconductor layer 201, the concentration of the ions 201X is less than or equal to $5*10^{\wedge}19$ atoms/cc. The third depth is from 600 to 1300 Å.

Optionally, at a fourth depth of the surface region, proximal to the source electrode 202 and the drain electrode 203, of the amorphous silicon semiconductor layer 201, the concentration of the ions 201X is less than or equal to $3*10^{\wedge}19$ atoms/cc. The fourth depth is greater than or equal to 1300 Å.

Optionally, FIG. 4 is another schematic structural diagram of a display panel where an amorphous silicon thin-film transistor is configured according to an embodiment of the present disclosure. As illustrated in FIG. 4, the amorphous silicon semiconductor layer 201 includes a source electrode contact region 2011, a drain electrode contact region 2012, and a channel region 2013 disposed between the source electrode contact region 2011 and the drain electrode contact region 2012. The source electrode contact region 2011 is electrically connected to the source electrode 202, and the drain electrode contact region 2012 is electrically connected to the drain electrode 203. The channel region 2013 is not in direct contact with the source electrode 202 and the drain electrode 203.

The source electrode contact region 2011 and the drain electrode contact region 2012 are both doped with the ions 201X, and the channel region 2013 may be doped with a few ions 201X. In this way, a leakage current in the channel region 2013 is small, and further a leakage current in the amorphous silicon thin-film transistor is small.

Optionally, a concentration of ions 201X doped in a region, proximal to the base substrate 21, of the source electrode contact region 2011 and the drain electrode contact region 2012 is less than or equal to $3*10^{\wedge}19$ atoms/cc. In this way, a leakage current in the region, proximal to the base substrate 21, of the source electrode contact region 2011 and the drain electrode contact region 2012 is small, and thus the leakage current in the amorphous silicon thin-film transistor is small.

Optionally, a concentration of ions 201X doped in the channel region 2013 is less than or equal to $3*10^{\wedge}19$ atoms/cc. A thickness D1 of the channel region 2013 and a thickness D1 of the region, proximal to the base substrate 21, of the source electrode contact region 2011 and the drain electrode contact region 2012 are from 500 to 1000 Å. Based on this, on the one hand, a small thickness of the channel region 2013 may ensure that the number of ions 201X doped in unit volume of the channel region 2013 is small, such that the leakage current in the channel region 2013 is small; on the other hand, when a side, distal from the base substrate 21, of the channel region 2013 is patterned, the thickness of the channel region 2013 is prevented from being thinner which is caused by over etching, and the performance of the amorphous silicon thin-film transistor is prevented from being affected.

Referring to FIG. 4, thicknesses D2 of the source electrode contact region 2011 and the drain electrode contact region 2012 are equal. In this way, conduction characteristics of the source electrode contact region 201 and the drain electrode contact region 2012 are basically the same, and thus the performance of the amorphous silicon thin-film transistor is stable.

Further, a difference between the thickness of the source electrode contact region 2011 and the drain electrode contact region 2012 and the thickness of the channel region 2013 may be greater than or equal to 500 Å. In general, a depth of a part where a concentration of ions 201X is large in a direction perpendicular to a thickness direction of the base substrate 21, of the source electrode contact region 2011 and the drain electrode contact region 2012 may be less than or equal to 500 Å. Therefore, due to the difference between the thickness of the source electrode contact region 2011 and the drain electrode contact region 2012 and the thickness of the channel region 2013 being greater than or equal to 500 Å, the source electrode contact region 2011 and the drain electrode contact region 2012 are provided with the ions 201X. Synchronously, the channel region 2013 is prevented from including the ions 201X. In this way, in the case that the source electrode contact region 2011 is in great ohmic contact with the source electrode 202 and the drain electrode contact region 2012 are in great ohmic contact with the drain electrode 203, the leakage current in the channel region 2013 is decreased. In this way, the switching characteristic of the amorphous silicon thin-film transistor is improved.

Optionally, the ions 201X include phosphorus ions. By doping the phosphorus ions ($P^+$) into the source electrode contact region 2011 and the drain electrode contact region 2012 of the amorphous silicon semiconductor layer 201, the source electrode 202 and the drain electrode 203 are in great ohmic contact with the amorphous silicon semiconductor layer 201. It is beneficial to enhance the on-state current in an on state and to improve the conductivity of the amorphous silicon thin-film transistor.

Optionally, FIG. 5 is still another schematic structural diagram of a display panel where an amorphous silicon thin-film transistor is configured according to an embodiment of the present disclosure. As illustrated in FIG. 5, the amorphous silicon semiconductor layer includes a first amorphous silicon semiconductor layer 201a and a second amorphous silicon semiconductor layer 201b that are stacked along a side distal from the base substrate 21. A thickness of the first amorphous silicon semiconductor layer 201a is less than a thickness of the second amorphous silicon semiconductor layer 201b, and a film layer deposition rate when the first amorphous silicon semiconductor layer 201a is formed is less than a film layer deposition rate when the second amorphous silicon semiconductor layer 201b is formed. A density of the film layer may be negatively correlated with the film layer deposition rate. That is, the greater the film layer deposition rate, the smaller the density of the film layer; and the smaller the film layer deposition rate, the greater the density of the film layer. In this way, the film layer deposition rate of the second amorphous silicon semiconductor layer 201b may be greater than the film layer deposition rate of the first amorphous silicon semiconductor layer 201a, such that the density of the first amorphous semiconductor layer 201a is greater than the density of the second amorphous semiconductor layer 201b.

When the first amorphous silicon semiconductor layer 201a with a small thickness is formed, by configuring a small film layer deposition rate, the density of the first amorphous silicon semiconductor layer 201a is great, defects are reduced, and the first amorphous silicon semiconductor layer 201a is better attached to a gate electrode insulator layer 205. In this way, the performance of the amorphous silicon thin-film transistor may be ensured. When the second amorphous silicon semiconductor layer 201a with a large thickness is formed, the film layer deposition rate may be accelerated appropriately, such that an efficiency in preparing the amorphous silicon semiconductor layer 201 is improved.

Optionally, a ratio of the thickness of the first amorphous silicon semiconductor layer 201a to the thickness of the second amorphous silicon semiconductor layer 201b ranges from 0.1 to 0.5. In this range, the efficiency in preparing the amorphous silicon semiconductor layer 201 may be improved effectively on the premise that the performance of the amorphous silicon semiconductor layer 201 is ensured.

Optionally, the amorphous silicon semiconductor layer is obtained by successively performing the ion implantation process, a wet etching process, and a one-time patterning process on the amorphous silicon thin film. During the ion implantation process, the number and depth of ions implanted into the amorphous silicon semiconductor layer may be controlled precisely by controlling an energy and a dose of the ion implantation. The energy of the ion implantation may determine an implantation depth of the ions implanted into the amorphous silicon semiconductor layer, and the dose of the ion implantation may determine the number of ions implanted into the amorphous silicon semiconductor layer. It should be noted that, the energy and dose of the ion implantation may be configured with parameters according to actual needs, which is not limited herein.

An etching thickness of the amorphous silicon thin film may be precisely controlled by configuring a wet etching process, and thus etching degrees of the amorphous silicon thin film are uniform, such that the stability of the prepared amorphous silicon thin-film transistor is ensured.

The one-time patterning process may pattern the amorphous silicon thin film to form the amorphous silicon semiconductor layer including the source electrode contact region, the drain electrode contact region, and the channel region.

As illustrated in FIG. 5, the amorphous silicon thin-film transistor 20 further includes a gate electrode 204 and the gate electrode insulator layer 205 that are successively stacked on the base substrate 21, and are disposed on a side, proximal to the base substrate 21, of the amorphous silicon semiconductor layer 201. The gate electrode insulator layer 205 may be made of silicon dioxide ($SiO_2$), silicon nitride ($Si_3N_4$), or mixed material of silicon dioxide and silicon nitride. It should be noted that, FIG. 5 shows an amorphous silicon thin-film transistor with a bottom gate structure, and the amorphous silicon thin-film transistor in the embodiments of the present disclosure may also be a top gate structure, which is not limited herein.

In summary, the embodiments of the present disclosure provide an amorphous silicon thin-film transistor. The ions doped by the ion implantation process are present in the region, proximal to the source electrode and the drain electrode, of the amorphous silicon semiconductor layer of the amorphous silicon thin film, and the concentration of the ions in the surface region, proximal to the source electrode and the drain electrode, of the amorphous silicon semiconductor is greater than or equal to $5*10^{\wedge}20$ atoms/cc. In this way, the amorphous silicon semiconductor layer is in great ohmic contact with the source electrode and the drain electrode, and thus the one-state current in the amorphous silicon thin-film transistor may be enhanced.

An embodiment of the present disclosure provides a method for preparing an amorphous silicon thin-film transistor. The method may be employed to prepare the amorphous silicon thin-film transistor 20 shown in FIG. 3. The method may include: an amorphous silicon semiconductor layer 201, a source electrode 202, and a drain electrode 203 are formed successively on a base substrate 21.

The amorphous silicon semiconductor layer 201 is formed prior to forming the source electrode 202 and the drain electrode 203. Specifically, forming the amorphous silicon semiconductor layer 201 includes:

successively depositing a non-patterned amorphous silicon thin film and a non-patterned buffer layer on the base substrate 21, wherein the buffer layer is made of silicon oxide, silicon nitride, or silicon nitrogen oxide;

implanting ions into a surface of a side, distal from the base substrate, of the buffer layer by an ion implantation process, wherein the ions diffuse from the buffer layer to an amorphous silicon thin-film layer; and obtaining the amorphous silicon semiconductor layer 201 by etching, by a wet etching process, the amorphous silicon thin film doped with the ions and the buffer layer doped with the ions, wherein a concentration of ions 201X in a surface region, proximal to the source electrode 202 and the drain electrode 203, of the amorphous silicon semiconductor layer 201 is greater than or equal to 5*10^20 atoms/cc.

In this way, a contact resistance between the source electrode 202 and the amorphous silicon semiconductor layer 201 and a contact resistance between the drain electrode 203 and the amorphous silicon semiconductor layer 201 may be reduced, such that the amorphous silicon semiconductor layer 201 is in great ohmic contact with the source electrode 202 and the drain electrode 203, and thus the amorphous silicon thin-film transistor 20 is provided with a great on-state current. Therefore, the amorphous silicon thin-film transistor 20 has a high on-to-off current ratio.

In summary, the embodiments of the present disclosure provide a method for preparing an amorphous silicon thin-film transistor. The ions doped by the ion implantation process are present in the region, proximal to the source electrode and the drain electrode, of the amorphous silicon semiconductor layer of the amorphous silicon thin-film transistor prepared by the method, and the concentration of the ions in the surface region, proximal to the source electrode and the drain electrode, of the amorphous silicon semiconductor layer is greater than or equal to 5*10^20 atoms/cc. In this way, the amorphous silicon semiconductor layer is in great ohmic contact with both the source electrode and the drain electrode, and thus the on-state current of the amorphous silicon thin-film transistor is enhanced.

FIG. 6 is a flowchart of another method for preparing an amorphous silicon thin-film transistor according to an embodiment of the present disclosure. The method may be employed to prepare the amorphous silicon thin-film transistor as defined above, such as the amorphous silicon thin-film transistor shown in FIG. 3. Referring to FIG. 6, the method may include the following steps.

In step 501, a non-patterned amorphous silicon thin film and a non-patterned buffer layer are successively deposited on a base substrate.

The buffer layer may be made of silicon oxide, silicon nitride, or silicon nitrogen oxide.

In the embodiments of the present disclosure, a base substrate 21 may be obtained firstly, and a first amorphous silicon sub-thin film is deposited on a side of the base substrate 21 in a first film layer deposition rate, and then a second amorphous silicon sub-thin film is deposited on a side, distal from the base substrate 21, of the first amorphous silicon sub-thin film in a second film layer deposition rate. In this way, the amorphous silicon thin film is formed on the base substrate 21. Moreover, the amorphous silicon thin film may cover the entire base substrate 21.

The second film layer deposition rate may be greater than the first film layer deposition rate. For example, the first film layer deposition rate may be from 4 to 8 Å/s, and the second film layer deposition rate may be from 30 to 50 Å/s.

Optionally, a thickness of the amorphous silicon thin film may be greater than or equal to 1600 Å and less than or equal to 2300 Å. A thickness of the first amorphous silicon sub-thin film may be greater than or equal to 300 Å and less than or equal to 600 Å, and a thickness of the second amorphous silicon sub-thin film may be greater than or equal to 1300 Å and less than or equal to 1700 Å.

The base substrate 21 may be made of glass, polyimide, or the like.

A thickness of the buffer layer may be less than the thickness of the amorphous silicon thin film. For example, the thickness of the amorphous silicon thin film may be from 1400 to 2000 Å, and the thickness of the buffer layer may be from 200 to 300 Å.

In step 502, ions are implanted into a surface of a side, distal from the base substrate, of the buffer layer by an ion implantation process, wherein the ions diffuse from the buffer layer to the amorphous silicon thin-film layer.

In the embodiments of the present disclosure, an atmosphere configured in the ion implantation process may include phosphine, and phosphorus ions in the phosphine may be implanted into the buffer layer and the amorphous silicon thin film. In the ion implantation process, an ion dose is greater than or equal to $e^{15}$ ions per square centimeter, and an acceleration voltage is greater than or equal to 20 kilovolts and less than or equal to 30 kilovolts.

Figure 7:
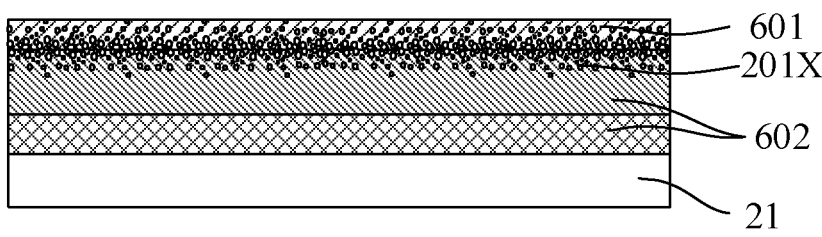
FIG. 7 is a schematic structural diagram of a base substrate according to an embodiment of the present disclosure.

FIG. 7 is a schematic structural diagram of a base substrate upon completion of step 502. The buffer layer 601 and the amorphous silicon thin film 602 that are doped with the ions 201X by the ion implantation process are formed om the base substrate 21.

It should be understood that in the embodiments of the present disclosure, the buffer layer is made of a material with a high ion penetrability, which is similar to the amorphous silicon. For example, the material of the buffer layer may at least include silicon dioxide; and alternatively, the material of the buffer layer may further include silicon nitride.

Figure 8:
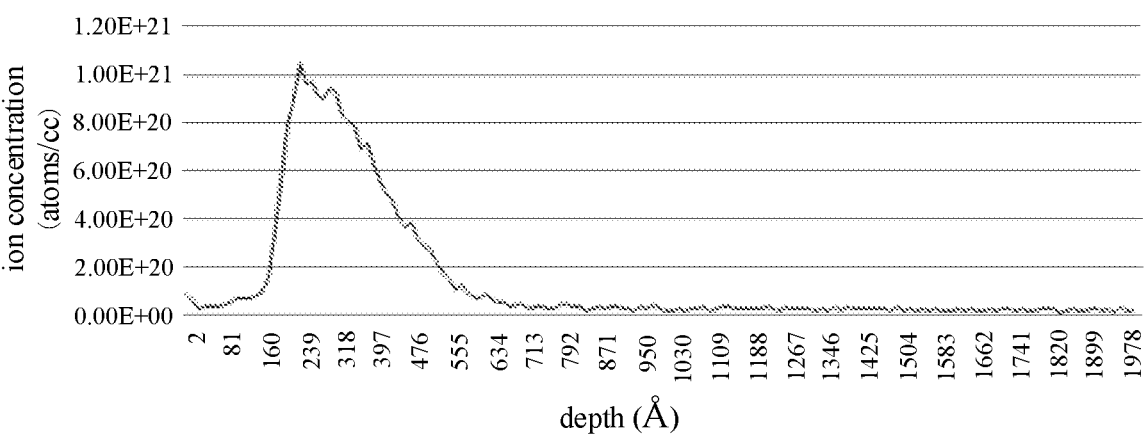
FIG. 8 is a diagram of a change relationship of a concentration of ions, along with depth, in a buffer layer and an amorphous silicon thin film according to an embodiment of the present disclosure.

Based on this, in the case that the ions are implanted into the buffer layer and the amorphous silicon thin film by the ion implantation process, FIG. 8 is a diagram of a change relationship of a concentration of ions, along with depth, in a buffer layer and an amorphous silicon thin film upon completion of step 502. As illustrated in FIG. 8, the abscissa represents a depth, and the unit of the depth is A; and the ordinate represents an ion concentration, and the unit of the ion concentration is atoms/cc. Distribution of the ions in a thickness direction of the buffer layer and the amorphous silicon thin film is approximately normal. Because the thickness of the buffer layer is small, the concentration of the ions implanted into the buffer layer progressively increases along the thickness direction of the buffer layer, and the concentration of the ions implanted into the amorphous silicon thin film progressively increases and then decreases along the thickness direction of the amorphous silicon thin film.

It should be further understood that, because a depth of the ion implantation is correlated with an energy of the ion implantation, the thickness of the buffer layer formed in step 501 may be determined based on the energy of the ion implantation. In this way, in the case that the ions are implanted into the buffer and the amorphous silicon thin film, the concentration of the ions in the buffer layer progressively increases along the thickness direction of the buffer layer, and the concentration of the ions in the amorphous silicon thin film progressively increases and then decreases along the thickness direction of the amorphous silicon thin film. That is, a part with the greatest ion concentration of the ions are disposed in the amorphous silicon thin film.

In step 503, an amorphous silicon semiconductor layer is obtained by etching, by a wet etching process, the buffer layer doped with the ions and the amorphous silicon thin film doped with the ions.

a concentration of the ions in a surface region, proximal to a source electrode and a drain electrode, of the amorphous silicon semiconductor layer is greater than or equal to 5*10^20 atoms/cc.

Step 503 may include steps 5031, 5032, and 5033:

In step 5031, a part of the buffer layer and a part of the amorphous silicon thin film that are disposed outside an active layer region are completely etched by the wet etching process.

The active layer region may refer to a region, where the amorphous silicon semiconductor layer is to be formed, in the amorphous silicon thin film.

In step 5032, a part, disposed in the active layer region, of the buffer layer is completely etched by the wet etching process, and the amorphous silicon thin film implanted with the ions is reserved.

That is, the part, disposed in the active layer region, of the buffer layer is completely etched. The amorphous silicon thin film implanted with the ions is reserved may be understood that the amorphous silicon thin film implanted with the ions is not etched or only partially etched. When the amorphous silicon thin film implanted with the ions is partially etched, an etching thickness of the wet etching process is from 20 to 30 Å.

Referring to FIG. 7 and FIG. 8 all together, the buffer layer 601 is provided with a fifth surface facing away from the base substrate 21, and the amorphous silicon thin film 602 is provided with a sixth surface proximal to the base substrate 21. In a direction from the fifth surface to the sixth surface, the number of ions doped in unit volume of the buffer layer 601 and the amorphous silicon thin film 602 progressively increases firstly, and then progressively decreases.

In the embodiments of the present disclosure, in order to cause the finally formed amorphous silicon semiconductor layer to be in great ohmic contact with the source electrode and the drain electrode, a part of a surface layer, where the number of ions 201X in unit volume is small, of the buffer layer 601 and the amorphous silicon thin film 602 may be etched by the wet etching process, such that the number of ions 201X in unit volume of a side, distal from the base substrate 21, of the etched amorphous silicon thin film is maximum. An etching solution configured in the wet etching process may be an acid etching solution, and further may be a hydrogen fluoride solution.

The part, where the number of the ions 201X in unit volume is small, of the buffer layer 601 and the amorphous silicon thin film 602 may refer to a film layer, where the number of the ions doped in unit volume of the buffer layer 601 and the amorphous silicon thin film 602 progressively increases in the direction from the fifth surface to the sixth surface.

It should be noted that, the etching thickness of the wet etching process is correlated with an implantation energy of the ion implantation process. In general, the greater the energy of the ion implantation, the greater the depth of the ion implantation, and the greater the etching thickness of the wet etching process correspondingly, such that the part of the surface layer, where the number of the ions 201X in unit volume is small, of the amorphous silicon thin film 602 and the entire buffer layer 601 may be both etched. For example, the etching solution configured in the wet etching process is the hydrogen fluoride solution, and the etching thickness of the wet etching process is greater than or equal to 220 Å and less than or equal to 330 Å. An etching thickness of a side, distal from the base substrate 21, of the amorphous silicon thin film 602 doped with the ions is greater than or equal to 20 Å and less than or equal to 30 Å.

In the case that the etching solution configured in the wet etching process is the hydrogen fluoride solution, a ratio of an etching rate of the hydrogen fluoride solution on the buffer layer 601 to an etching rate of hydrogen fluoride solution on the amorphous silicon thin film 602 is greater than or equal to 10. For example, the etching rate of the hydrogen fluoride solution on the buffer layer 601 ranges from 5 Å/s to 20 Å/s, and the etching rate of the hydrogen fluoride solution on the amorphous silicon thin film 602 ranges from 0.5 Å/s to 2 Å/s.

Because the etching rate of the hydrogen fluoride solution on the buffer layer 601 is much greater than the etching rate of hydrogen fluoride solution on the amorphous silicon thin film 602, on the one hand, an efficiency in preparing the amorphous silicon thin-film transistor may be improved; on the other hand, the etching thicknesses of the buffer layer 601 and the amorphous silicon thin film 602 may be precisely controlled according to the ratio of the etching rate of the buffer layer 601 to the etching rate of the amorphous silicon thin film 602.

In step 5033, a channel region, disposed between a source electrode contact region and a drain electrode contact region, in the reserved amorphous silicon thin film is etched, and a part, where a concentration of the ions is less than or equal to $3*10^{19}$ atoms/cc, of the channel region is reserved.

An etching thickness of the channel region, disposed between the source electrode contact region and the drain electrode contact region, in the reserved amorphous silicon thin film is greater than or equal to 500 Å.

The amorphous silicon semiconductor layer may be obtained by etching a part, where the concentration of the ions is great, of the channel region. Referring to FIG. 4, the finally formed amorphous silicon semiconductor layer 201 includes the source electrode contact region 2011, the drain electrode contact region 2012, and the channel region 2013 disposed between the source electrode contact region 2011 and the drain electrode contact region 2012. The source electrode contact region 2011 and the drain electrode contact region 2012 are both doped with the ions 201X, and the concentration of the ions 201X doped in the channel region 2013 is small.

In step 504, the source electrode and the drain electrode are formed on the side, distal from the base substrate, of the etched amorphous silicon thin film.

A metal film may be formed on the side, distal from the base substrate 21, of the etched amorphous silicon thin film. The metal film may cover the entire base substrate 21. Afterwards, the source electrode 202 and the drain electrode 203 are obtained by performing a one-time patterning process on the metal film. The source electrode contact region 2011 is in contact with the source electrode 201, and the drain electrode contact region 2012 is in contact with the drain electrode 203. Upon completion of step 504, for the structure of the base substrate 21, reference may be made to FIG. 9.

Figure 9:
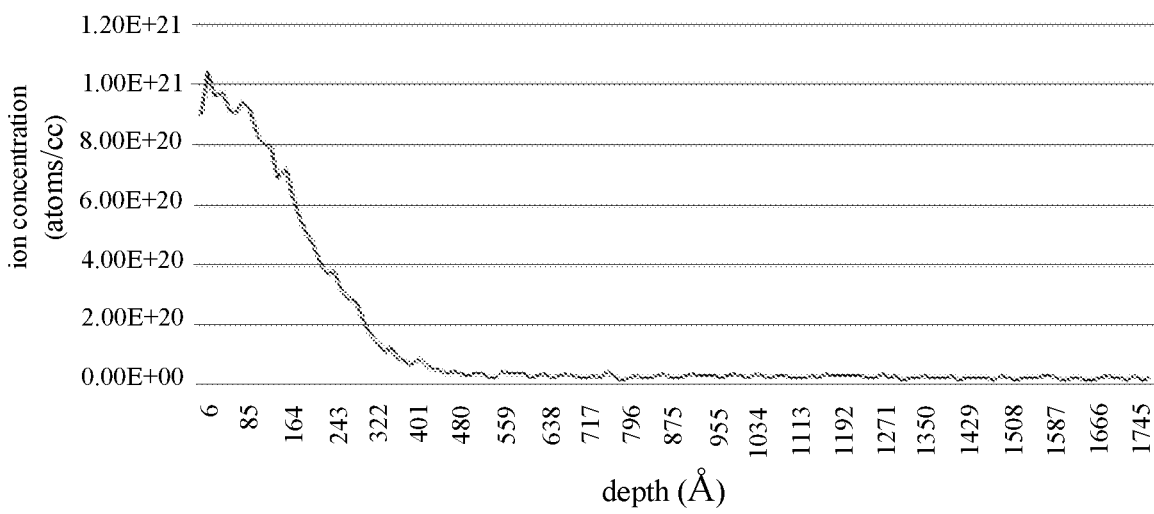
FIG. 9 is a change relation diagram of a concentration of ions, along with depth, in an amorphous silicon semiconductor layer according to an embodiment of the present disclosure.

FIG. 9 is a change relation diagram of a concentration of ions, along with depth, in an amorphous silicon semiconductor layer according to an embodiment of the present disclosure. Referring to FIG. 9, the abscissa is a depth, and the unit of the depth is A; the ordinate is an ion concentration, and the unit of the ion concentration is atoms/cc. The concentration of the ions 201X in the surface region, proximal to the source electrode 202 and the drain electrode 203, of the amorphous silicon semiconductor layer 201 according to the embodiments of the present disclosure is greater than or equal to $5*10^{20}$ atoms/cc.

In this way, the contact resistance between the source electrode 202 and the amorphous silicon semiconductor layer 201 and the contact resistance between the drain electrode 203 and the amorphous silicon semiconductor layer 201 may be reduced, such that the amorphous silicon semiconductor layer 201 is in great ohmic contact with the source electrode 202 and the drain electrode 203, and thus the amorphous silicon thin-film transistor 20 has a great on-state current. Moreover, a leakage current in a region, proximal to base substrate 21, of the source electrode contact region 2011 and the drain electrode contact region 2012 is small, and thus a leakage current in the amorphous silicon thin-film transistor is small. Therefore, the amorphous silicon thin film 20 has a high on-to-off current ratio.

Figure 13:
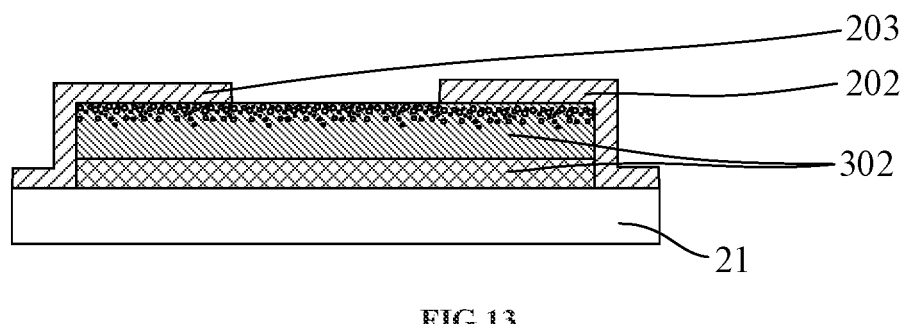
FIG. 13 is a schematic structural diagram of still another base substrate according to an embodiment of the present disclosure.

FIG. 10 is a comparison diagram of switching characteristics between an amorphous silicon thin-film transistor prepared by an embodiment of the present disclosure and an amorphous silicon thin-film transistor prepared by the related art. As illustrated in FIG. 10, the abscissa is a voltage, and the unit of the voltage is volt (V); and the ordinate is a current, and the unit of the current is ampere (A). The curve C1 in FIG. 13 is a curve of a drain current changing with a gate voltage in the amorphous silicon thin-film transistor of the embodiments of the present disclosure. The curve C2 is a curve of a drain current changing with a gate voltage in the amorphous silicon thin film prepared by depositing and doping in the related art. The curve C3 is a curve of a drain current changing with a gate current in an amorphous silicon thin-film transistor prepared by the ion implantation process without etching an amorphous silicon semiconductor layer.

As illustrated in FIG. 10, in the case that the gate voltage of the amorphous silicon thin-film transistor is positive, and the amorphous silicon thin-film transistor is in an on state, the amorphous silicon thin-film transistor prepared by the embodiments of the present disclosure has a great on-state current relative to the amorphous silicon thin-film transistor prepared by the related art. In the case that the gate voltage of the amorphous silicon thin-film transistor is negative, and the amorphous silicon thin-film transistor is in an off state, the amorphous silicon thin-film transistor prepared by the embodiments of the present disclosure has a small off-state current relative to the amorphous silicon thin-film transistor prepared by the related art. That is, the on-to-off current ratio of the amorphous silicon thin-film transistor prepared by the embodiments of the present disclosure is great. According to a test, the on-to-off current ratio of the amorphous silicon thin-film transistor in the embodiments of the present disclosure may be greater than or equal to 10^6.

In summary, the embodiments of the present disclosure provide a method for preparing an amorphous silicon thin-film transistor. The ions doped by the ion implantation process are present in the region, proximal to the source electrode and the drain electrode, of the amorphous silicon semiconductor layer of the amorphous silicon thin-film transistor prepared by the method, and the concentration of the ions in the surface region, proximal to the source electrode and the drain electrode, of the amorphous silicon semiconductor layer is greater than or equal to 5*10^20 atoms/cc. In this way, the amorphous silicon semiconductor layer is in great ohmic contact with the source electrode and the drain electrode, and thus the on-state current of the amorphous silicon thin-film transistor may be enhanced.

FIG. 11 is a flowchart of another method for preparing an amorphous silicon thin-film transistor according to an embodiment of the present disclosure. The method may be employed to prepare the amorphous silicon thin-film transistor according to the embodiments of the present disclosure, such as the amorphous silicon thin-film transistor shown in FIG. 3. As illustrated in FIG. 11, the method may include the following steps.

In step 401, an amorphous silicon thin film is formed on a base substrate.

In the embodiments of the present disclosure, one base substrate 21 may be obtained firstly, and a first amorphous silicon sub-thin film is deposited on a side of the base substrate 21 in a first film layer deposition rate, and then a second amorphous silicon sub-thin film is deposited on a side, distal from the base substrate 21, of the first amorphous silicon sub-thin film in a second film layer deposition rate. In this way, the amorphous silicon thin film is formed on the base substrate 21, and the amorphous silicon thin film may cover the entire base substrate 21.

The second film layer deposition rate may be greater than the first film layer deposition rate. For example, the first film layer deposition rate may be greater than or equal to 4 Å/s and less than or equal to 8 Å/s; and the second film layer deposition rate may be greater than or equal to 30 Å/s and less than or equal to 50 Å/s.

Optionally, a thickness of the amorphous silicon thin film may be greater than or equal to 1600 Å and less than or equal to 2300 Å. A thickness of the first amorphous silicon sub-thin film may be greater than or equal to 300 Å and less than or equal to 600 Å, and a thickness of the second amorphous silicon sub-thin film may be greater than or equal to 1300 Å and less than or equal to 1700 Å.

The base substrate 21 may be made of glass, polyimide, or the like.

In step 402, ions are doped in the amorphous silicon thin film by an ion implantation process.

The number and depth (that is, a concentration) of the ions 201X doped in the amorphous silicon thin film may be precisely controlled by configuring the ion implantation process to dope the ions 201X in the amorphous silicon thin film.

An atmosphere configured in the ion implantation process may include phosphine ($PH_3$). That is, the ions 201X may be phosphorus ions. In the ion implantation process, an ion dose may be greater than or equal to $e^{15}$ ions per square centimeter, and an acceleration voltage may be greater than or equal to 20 kilovolts and less than or equal to 30 kilovolts.

During the ion implantation process, the phosphorus ions in the phosphine may be implanted into the amorphous silicon thin film. The phosphorus ions implanted into the amorphous silicon thin film may improve the conductivity of the amorphous silicon thin film.

Exemplarily, FIG. 12 is a schematic structural diagram of another base substrate upon completion of step 402. The ions 201X doped by the ion implantation process are present in the amorphous silicon thin film 301 on the base substrate 21.

In step 403, a side, distal from the base substrate, of the amorphous silicon thin film doped with the ions is etched by a wet etching process.

Referring to FIG. 12, the ions 201X are implanted into the amorphous silicon thin film 301 by the ion implantation process, and distribution of the ions 201X in a thickness direction of the amorphous silicon thin film 301 is approximately normal distribution. Alternatively, it may be understood that: the amorphous silicon thin film 301 is provided with a third surface facing away from the base substrate 21 and a fourth surface proximal to the base substrate 21. In a direction from the third surface to the fourth surface, the number of ions doped in unit volume of the amorphous silicon thin film 301 progressively increases, and then progressively decreased.

In the embodiments of the present disclosure, in order to make the finally formed amorphous silicon semiconductor layer is in great ohmic contact with a source electrode and a drain electrode, a part of a surface layer, where the number of ions 201X in unit volume is small, of the amorphous silicon thin film 301 may be etched by the wet etching process, such that the number of ions 201X in unit volume of a side, distal from the base substrate 21, of the etched amorphous silicon thin film is maximum. An etching solution configured in the wet etching process may be a hydrogen fluoride solution.

The part of the surface layer, where the number of the ions 201X in unit volume is small, of the amorphous silicon thin film 301 may refer to a part, where the number of ions doped in unit volume of the amorphous silicon thin film 301 progressively increases in the direction from the fifth surface to the sixth surface, of the amorphous silicon thin film 301.

It should be noted that, an etching thickness of the wet etching process is correlated with an implantation energy of the ion implantation process. In general, the greater the energy of the ion implantation, the greater the depth of the ion implantation, and the greater the etching thickness of the wet etching process correspondingly, such that the part of the surface layer, where the number of the ions 201X in unit volume is small, of the amorphous silicon thin film 301 may be completely etched. For example, the etching thickness of the wet etching process may be greater than or equal to 220 Å and less than or equal to 330 Å.

In step 404, the source electrode and the drain electrode are formed on the side, distal from the base substrate, of the etched amorphous silicon thin film.

Firstly, a patterned amorphous silicon thin film is obtained by performing a one-time patterning process on the etched amorphous silicon thin film. An orthographic projection of the patterned amorphous silicon thin film on the base substrate may cover an orthographic projection of a gate electrode on the base substrate.

Secondly, a metal thin film may be formed on a side, distal from the base substrate 21, of the patterned amorphous silicon thin film. The metal thin film may cover the entire base substrate 21. Afterwards, the source electrode 202 and the drain electrode 203 are obtained by performing the one-time patterning process on the metal thin film.

Exemplarily, FIG. 13 is a schematic structural diagram of still another base substrate upon completion of step 404.

An overlapped region is present between an orthographic projection of the source electrode 202 on the base substrate 21 and an orthographic projection of the etched amorphous silicon thin film 302 on the base substrate 21. An overlapped region is present between an orthographic projection of the drain electrode 203 on the base substrate 21 and the orthographic projection of the etched amorphous silicon thin film 302 on the base substrate 21.

In step 405, the amorphous silicon semiconductor layer is obtained by performing the one-time patterning process on the etched amorphous silicon thin film.

Referring to FIG. 4, in the embodiments of the present disclosure, that the one-time patterning process is performed on the etched amorphous silicon thin film may include: configuring the source electrode 202 and the drain electrode 203 as masks, the amorphous silicon semiconductor layer (201a and 201b) is obtained by etching, by an etching process, a surface layer of a channel region of the amorphous silicon thin film to etch off a part of the surface layer doped with the ions. Referring to FIG. 4, the finally formed amorphous silicon semiconductor layer 201 includes a source electrode contact region 2011, a drain electrode contact region 2012, and the channel region 2013 disposed between the source electrode contact region 2011 and the drain electrode contact region 2012. The source electrode contact region 2011 and the drain electrode contact region 2012 are both doped with the ions 201X, and the channel region 2013 is not doped with the ions. The source electrode contact region 2011 is in contact with the source electrode 202, and the drain electrode contact region 2012 is in contact with the drain electrode 203.

An etching thickness of the etching process in the one-time patterning process may be greater than or equal to 500 Å. In this way, the channel region of the etched amorphous silicon semiconductor layer 201 is not doped with the ions, or a concentration of ions in the channel region is small, such that a leakage current in the amorphous silicon thin-film transistor is small, and thus the amorphous silicon thin-film transistor has a small off-state current.

In step 406, because the source electrode 202 and the drain electrode 203 may be configured as masks to etch again the etched amorphous silicon thin film, a preparation process of the amorphous silicon thin film may be simplified.

In summary, the embodiments of the present disclosure provide a method for preparing an amorphous silicon thin-film transistor. The ions doped by the ion implantation process are present in a region, proximal to the source electrode and the drain electrode, of the amorphous silicon semiconductor of the amorphous silicon thin-film transistor prepared by the method, and a concentration of the ions in a surface region, proximal to the source electrode and the drain electrode, of the amorphous silicon semiconductor layer is greater than or equal to 5*10^20 atoms/cc. In this way, the amorphous silicon semiconductor layer is in great ohmic contact with the source electrode and the drain electrode, and thus an on-state current in the amorphous silicon thin-film transistor is enhanced.

The embodiments of the present disclosure provide a display panel, referring to FIG. 3, the display panel 02 may include: a base substrate 21, and a plurality of amorphous silicon thin-film transistors 20 defined as above disposed on the base substrate 21 (FIG. 3 shows one of the amorphous silicon thin-film transistors). The base substrate 21 may synchronously include the amorphous silicon thin-film transistors 20 and low temperature poly-silicon thin-film transistors. The amorphous silicon thin-film transistor 20 may be the amorphous silicon thin-film transistor 20 shown in FIG. 3 or FIG. 5.

Optionally, the base substrate includes a display region and a peripheral region, and the amorphous silicon thin-film transistor may be disposed in the display region; and the display panel may further include: a plurality of low temperature poly-silicon (LTPS) transistors disposed in the peripheral region.

The amorphous silicon thin-film transistor and the low temperature poly-silicon transistor may be prepared by an ion implantation process in the same production line.

The embodiments of the present disclosure provide a display device. The display device may include a supply assembly and the display panel defined as above. The supply assembly is configured to supply power to the display panel.

Optionally, the display device may be a liquid crystal display device, an organic light-emitting diode (OLED) display device (e.g., an active-matrix organic light-emitting diode, AMOLED), an electronic paper, a mobile phone, an iPAD, a television, a display, a notebook, a digital photo frame, a navigator, or any product or component with display and fingerprint identification functions.

Described above are merely optional embodiments of the present disclosure, and are not intended to limit the present disclosure. Any modifications, equivalent substitutions, improvements, and the like may be made within the protection scope of the present disclosure, without departing from the spirit and principles of the present disclosure.

What is claimed is:

1. An amorphous silicon thin-film transistor, comprising: an amorphous silicon semiconductor layer, a source electrode, and a drain electrode that are successively disposed on a base substrate;

wherein ions doped by an ion implantation process are present in a region, proximal to the source electrode and the drain electrode, of the amorphous silicon semiconductor layer, a concentration of the ions in a surface region, proximal to the source electrode and the drain electrode, of the amorphous silicon semiconductor layer being greater than or equal to $5*10^{20}$ atoms/cc, wherein the ions doped by the ion implantation process are present at the depth of the surface region, proximal to the source electrode and the drain electrode, of the amorphous silicon semiconductor layer, and the concentration of the ions increases first and then decreases along a direction away from the surface region;

wherein a thickness of a region where the concentration of the ions increases is less than a thickness of a region where the concentration of the ions decreases.

2. The amorphous silicon thin-film transistor according to claim 1, wherein the ions doped by the ion implantation process are present at a depth of the surface region, proximal to the source electrode and the drain electrode, of the amorphous silicon semiconductor layer, and the concentration of the ions decreases along a direction away from the surface region.

3. The amorphous silicon thin-film transistor according to claim 2, wherein at a first depth of the surface region, proximal to the source electrode and the drain electrode, of the amorphous silicon semiconductor layer, the concentration of the ions is greater than or equal to $3*10^{20}$ atoms/cc, the first depth being from 0 to 50 Å excluding 0.

4. The amorphous silicon thin-film transistor according to claim 3, wherein at a second depth of the surface region, proximal to the source electrode and the drain electrode, of the amorphous silicon semiconductor layer, the concentration of the ions is greater than or equal to $5*10^{20}$ atoms/cc, the second depth being from 0 to 20 Å excluding 0;

at a third depth of the surface region, proximal to the source electrode and the drain electrode, of the amorphous silicon semiconductor layer, the concentration of the ions is greater than or equal to $5*10^{19}$ atoms/cc, the third depth being from 600 to 1300 Å; and at a fourth depth of the surface region, proximal to the source electrode and the drain electrode, of the amorphous silicon semiconductor layer, the concentration of the ions is greater than or equal to $3*10^{19}$ atoms/cc, the fourth depth being greater than or equal to 1300 Å.

5. The amorphous silicon thin-film transistor according to claim 1, wherein the amorphous silicon semiconductor layer comprises a source electrode contact region, a drain electrode contact region, and a channel region disposed between the source electrode contact region and the drain electrode contact region;

wherein the ions are disposed in the source electrode contact region and the drain electrode contact region.

6. The amorphous silicon thin-film transistor according to claim 5, wherein a concentration of ions doped in a region, proximal to the base substrate, of the source electrode contact region and the drain electrode contact region is less than or equal to $3*10^{19}$ atoms/cc;

a concentration of ions doped in the channel region is less than or equal to $3*10^{19}$ atoms/cc; and a thickness of the channel region and a thickness of the region, proximal to the base substrate, of the source electrode contact region and the drain electrode contact region are from 500 to 1000 Å.

7. The amorphous silicon thin-film transistor according to claim 1, wherein the ions comprise phosphorus ions (P+).

8. The amorphous silicon thin-film transistor according to claim 1, wherein the amorphous silicon semiconductor layer comprises a first amorphous silicon semiconductor layer and a second amorphous silicon semiconductor layer that are stacked along a direction away from the base substrate;

wherein a thickness of the first amorphous silicon semiconductor layer is less than a thickness of the second amorphous silicon semiconductor layer, and a density of the first amorphous silicon semiconductor layer is greater than a density of the second amorphous silicon semiconductor layer.

9. The amorphous silicon thin-film transistor according to claim 8, wherein a ratio of the thickness of the first amorphous silicon semiconductor layer to the thickness of the second amorphous silicon semiconductor layer ranges from 0.1 to 0.5.

10. The amorphous silicon thin-film transistor according to claim 1, wherein the amorphous silicon semiconductor layer is obtained by successively preforming the ion implantation process, a wet etching process, and a one-time patterning process on an amorphous silicon thin film.

11. A display panel, comprising: a base substrate, and a plurality of amorphous silicon thin-film transistors disposed on the base substrate;

wherein the amorphous silicon thin-film transistor comprises:

an amorphous silicon semiconductor layer, a source electrode, and a drain electrode that are successively disposed on a base substrate;

wherein ions doped by an ion implantation process are present in a region, proximal to the source electrode and the drain electrode, of the amorphous silicon semiconductor layer, a concentration of the ions in a surface region, proximal to the source electrode and the drain electrode, of the amorphous silicon semiconductor layer being greater than or equal to $5*10^{20}$ atoms/cc;

wherein the base substrate is provided with the amorphous silicon thin-film transistors and low temperature poly-silicon thin-film transistors synchronously, wherein the ions doped by the ion implantation process are present at the depth of the surface region, proximal to the source electrode and the drain electrode, of the amorphous silicon semiconductor layer, and the concentration of the ions increases first and then decreases along a direction away from the surface region;

wherein a thickness of a region where the concentration of the ions increases is less than a thickness of a region where the concentration of the ions decreases.

12. An amorphous silicon thin-film transistor, comprising: an amorphous silicon semiconductor layer, a source electrode, and a drain electrode that are successively disposed on a base substrate;

wherein ions doped by an ion implantation process are present in a region, proximal to the source electrode and the drain electrode, of the amorphous silicon semiconductor layer, a concentration of the ions in a surface region, proximal to the source electrode and the drain electrode, of the amorphous silicon semiconductor layer being greater than or equal to $5*10^{20}$ atoms/cc, wherein the amorphous silicon semiconductor layer comprises a first amorphous silicon semiconductor layer and a second amorphous silicon semiconductor layer that are stacked along a direction away from the base substrate;

wherein a thickness of the first amorphous silicon semiconductor layer is less than a thickness of the second amorphous silicon semiconductor layer, and a density of the first amorphous silicon semiconductor layer is greater than a density of the second amorphous silicon semiconductor layer, wherein a ratio of the thickness of the first amorphous silicon semiconductor layer to the thickness of the second amorphous silicon semiconductor layer ranges from 0.1 to 0.5.

* * * * *